(12) United States Patent
Altice

(10) Patent No.: US 7,605,440 B2
(45) Date of Patent: Oct. 20, 2009

(54) PIXEL CELL ISOLATION OF CHARGE STORAGE AND FLOATING DIFFUSION REGIONS USING DOPED WELLS

(75) Inventor: Parker Altice, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 196 days.

(21) Appl. No.: 11/399,357

(22) Filed: Apr. 7, 2006

(65) Prior Publication Data

US 2007/0235827 A1    Oct. 11, 2007

(51) Int. Cl.
| | |
|---|---|
| H01L 31/06 | (2006.01) |
| H01L 31/062 | (2006.01) |
| H01L 31/113 | (2006.01) |
| H01L 29/417 | (2006.01) |
| H01L 29/74 | (2006.01) |
| H01L 31/111 | (2006.01) |
| H01L 27/15 | (2006.01) |
| H01L 29/16 | (2006.01) |
| H01L 31/12 | (2006.01) |
| H01L 33/00 | (2006.01) |
| H01L 29/161 | (2006.01) |
| H01L 31/153 | (2006.01) |
| H01L 29/26 | (2006.01) |

(52) U.S. Cl. .............. 257/462; 257/80; 257/82; 257/83; 257/84; 257/113; 257/114; 257/115; 257/116; 257/117; 257/118; 257/290; 257/291; 257/292; 257/293; 257/294; 257/463; 257/E27.133

(58) Field of Classification Search .................. 257/80, 257/82–84, 113–118, 290–294, 462–463, 257/E27.133
See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,326,868 B1 | 12/2001 | Kranz et al. | |
| 6,333,205 B1 | 12/2001 | Rhodes | |
| 6,686,220 B2 * | 2/2004 | Rhodes et al. | 438/69 |
| 6,756,616 B2 * | 6/2004 | Rhodes | 257/291 |
| 6,856,001 B2 * | 2/2005 | Rhodes | 257/519 |
| 6,908,839 B2 * | 6/2005 | Rhodes | 438/595 |
| 6,927,089 B2 * | 8/2005 | Rhodes | 438/57 |
| 7,153,719 B2 * | 12/2006 | Patrick et al. | 438/60 |
| 7,211,848 B2 * | 5/2007 | Rhodes | 257/292 |
| 7,427,734 B2 * | 9/2008 | Yang et al. | 250/208.1 |
| 7,432,121 B2 * | 10/2008 | Brady et al. | 438/48 |
| 7,538,372 B2 * | 5/2009 | Rhodes | 257/291 |
| 2003/0169360 A1 * | 9/2003 | Rhodes | 348/308 |
| 2005/0059180 A1 * | 3/2005 | Rhodes | 438/22 |

(Continued)

*Primary Examiner*—Ida M Soward
(74) *Attorney, Agent, or Firm*—Dickstein Shapiro LLP

(57) ABSTRACT

A pixel having a well-isolated charge storage region or floating diffusion region may be obtained by providing a separate P-well around the storage region or floating diffusion region. In one embodiment, a separate P-well entirely encases the storage region and is in contact with the storage region. This P-well provides an electrical barrier for preventing electrons that are generated elsewhere in the pixel from contaminating the storage region. In another embodiment, a first separate P-well encases and is in contact with the storage region and a second separate P-well encases and is in contact with the floating diffusion region.

13 Claims, 11 Drawing Sheets

U.S. PATENT DOCUMENTS

| | | | |
|---|---|---|---|
| 2006/0244015 A1* | 11/2006 | Rhodes | 257/225 |
| 2006/0255372 A1* | 11/2006 | Patrick et al. | 257/225 |
| 2006/0267053 A1* | 11/2006 | Yang et al. | 257/291 |
| 2007/0045680 A1* | 3/2007 | Ladd et al. | 257/291 |
| 2007/0084986 A1* | 4/2007 | Yang et al. | 250/208.1 |
| 2007/0131992 A1* | 6/2007 | Dosluoglu et al. | 257/292 |
| 2008/0210996 A1* | 9/2008 | Fossum et al. | 257/292 |

* cited by examiner

PIXEL CELL ISOLATION OF CHARGE STORAGE AND FLOATING DIFFUSION REGIONS USING DOPED WELLS

FIELD OF THE INVENTION

The invention relates to the field of semiconductor devices and, in particular, to structures that provide increased isolation around charge storage regions of solid state imager devices.

BACKGROUND OF THE INVENTION

Solid state imager devices have become popular imaging devices for cameras, scanners, and the like. There are several types of such imagers, with CCD and CMOS imagers being particularly prevalent commercially. A CMOS imager device includes a focal plane array of pixel cells, each cell includes a photosensor, for example, a photogate, photoconductor or a photodiode overlying a substrate for producing photo-generated charge in a doped region of the substrate. A readout circuit is provided for each pixel cell and includes at least a source follower transistor and a row select transistor for coupling the source follower transistor to a column output line. The pixel cell also typically has a floating diffusion region, connected to the gate of the source follower transistor. Charge generated by the photosensor is sent to the floating diffusion region. The imager may also include a transistor for transferring charge from the photosensor to the floating diffusion region and another transistor for resetting the floating diffusion region to a predetermined charge level prior to charge transference. Each pixel cell is isolated from other pixel cells in the array by a field oxide region (STI), which surrounds it and separates the doped regions of the substrate within that pixel cell from the doped regions of the substrate within neighboring pixel cells.

In a CMOS imager, the active elements of a pixel cell, for example a four transistor pixel cell, perform the necessary functions of (1) photon to charge conversion; (2) transfer of charge to the floating diffusion region; (3) resetting the floating diffusion region to a known state; (4) selection of a pixel cell for readout; and (5) output and amplification of a signal representing a reset voltage and a pixel signal voltage based on the photo converted charges. The charge at the floating diffusion region is converted to a pixel output voltage by the source follower output transistor.

FIG. 1 illustrates a simplified block diagram of a CMOS imager device 300 having a pixel array 310 with each pixel cell being constructed as described above. Pixel array 310 comprises a plurality of pixel cells arranged in a predetermined number of columns and rows. The pixel cells of each row in array 310 are all turned on at the same time by a row select line. Signals of pixel cells of each column are selectively output onto output lines by respective column select lines. A plurality of row and column lines are provided for the entire array 310. The row lines are selectively activated by the row driver 345 in response to row address decoder 355 and the column select lines are selectively activated by the column driver 360 in response to column address decoder 370. Thus, a row and column address is provided for each pixel cell.

The CMOS imager is operated by a control circuit 350, which controls decoders 355, 370 for selecting the appropriate row and column lines for pixel cell readout, and row and column driver circuitry 345, 360, which apply driving voltage to the drive transistors of the selected row and column lines. The pixel signals, which typically include a pixel cell reset signal Vrst and a pixel image signal Vsig for each pixel are read by sample and hold circuitry 361 associated with the column device 360. A differential signal Vrst-Vsig is produced for each pixel, which is amplified by an amplifier 362 and digitized by analog-to-digital converter 375. The analog to digital converter 375 converts the analog pixel signals to digital signals, which are fed to an image processor 380 to form a digital image.

Exemplary CMOS imaging circuits, processing steps thereof, and detailed descriptions of the functions of various elements of a CMOS imaging circuit are described, for example, in U.S. Pat. Nos. 6,140,630, 6,326,868, 6,310,366, 6,326,652, 6,204,524, and 6,333,205, assigned to Micron Technology, Inc. The disclosures of each of the forgoing are hereby incorporated by reference herein in their entirety.

A schematic diagram of an exemplary CMOS five-transistor (5T) pixel cell 10 is illustrated in FIG. 2. The five transistors include a shutter gate 30, transfer gate 32, reset gate 34, source follower transistor 36 and row select transistor 38. A photosensor 40 converts incident light into an electrical charge. A shutter gate 30 opens, when activated by a global shutter signal SG applied to all shutter gates 30 in a pixel array, and the storage node 50 receives the charge from the photosensor 40. A floating diffusion region 55 receives the charge from the storage node 50 through the transfer gate 32, when activated by a transfer gate control signal TG, and is connected to the reset transistor 34 and the gate of the source follower transistor 36. The source follower transistor 36 outputs a signal proportional to the charge accumulated in the floating diffusion region 55 when the row select transistor 38 is turned on. The reset transistor 34 resets the floating diffusion region 55 and the storage node 50, when activated by a reset control signal RST, to a known potential prior to transfer of charge from the photosensor 40. The photosensor 40 may be a photodiode, photogate, or photoconductor. If a photodiode is employed, the photodiode may be formed below a surface of the substrate and may be a buried PNP photodiode, buried NPN photodiode, a buried PN photodiode, or a buried NP photodiode, among others.

In a conventional CMOS imager pixel with a buried photodiode, the photodiode converts incident light to an electrical charge. The photodiode accumulates this charge throughout an integration period. Charge is drained from the photodiode to the storage node 50, either throughout integration or at the end of integration. At the end of the integration period, the gate closes and isolates the photodiode from the storage node 50. During readout, the transfer gate 32 opens and closes and the charge is then transferred from storage node 50 to the floating diffusion region (node) 55 through the transfer gate.

Typical pixel designs use P-wells to provide an electrical barrier to help prevent cross-talk between neighboring pixels. The floating diffusion region 55 and the storage region 50 may be placed inside this P-well 20, as shown in FIG. 3. FIG. 3 illustrates a cross-section of a portion of the pixel cell 10, which is depicted electrically in FIG. 2. Because there is a lower voltage potential between the substrate and the P-well 20, any electrons generated outside the P-well 30 are prevented from entering the P-well 20 and potentially contaminating the storage node 50 and floating diffusion region 55, as well as from contaminating neighboring pixels.

However, some photoelectrons may be generated inside the P-well 30. These electrons can move to and contaminate the charges stored in the storage region and reduce shutter efficiency.

Therefore, it is desired to have a storage region with improved isolation.

BRIEF SUMMARY OF THE INVENTION

Exemplary embodiments of the invention provide a structure and a method of forming the structure in which a separate P-well surrounds the storage node and/or floating diffusion node. In one exemplary embodiment of the structure, a separate P-well entirely encases and is in contact with the storage node. This dedicated storage node P-well provides an electrical barrier for preventing electrons that are generated elsewhere in the pixel, such as photoelectrons generated within the main P-well, from contaminating charges in the storage node. In another exemplary embodiment of the structure, a first separate P-well encases and is in contact with the storage node and a second separate P-well encases and is in contact with the floating diffusion region. This dedicated storage node P-well and dedicated floating diffusion region P-well provide an electrical barrier for preventing electrons that may be generated elsewhere in the pixel from contaminating the photogenerated charge as stored and transferred through pixel circuitry for read out.

BRIEF DESCRIPTION OF THE DRAWINGS

These and other features of the invention are described in more detail below in connection with exemplary embodiments of the invention described below in connection with the accompanying drawings in which:

FIG. 5 illustrates a plan-view diagram of the pixel cell of FIG. 4a;

FIG. 7 illustrates a plan-view diagram of the pixel cell of FIG. 6a;

DETAILED DESCRIPTION OF THE INVENTION

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has a semiconductor surface. Substrate must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, gallium arsenide, or other semiconductor material. Furthermore, when reference is made to a "substrate" in the following description, previous process steps may have been utilized to form regions or junctions in and/or over the base semiconductor structure or foundation.

The term "pixel" or "pixel cell" refers to a picture element unit cell containing a photosensor and transistors for converting light radiation to an electrical signal. For purposes of illustration, a representative pixel cell is illustrated in the figures and description herein and, typically, fabrication of all pixel cells in an imager will proceed simultaneously in a similar fashion. The following detailed description is, therefore, not to be taken in a limiting sense, and the scope of the present invention is defined by the appended claims.

Figure 4A:
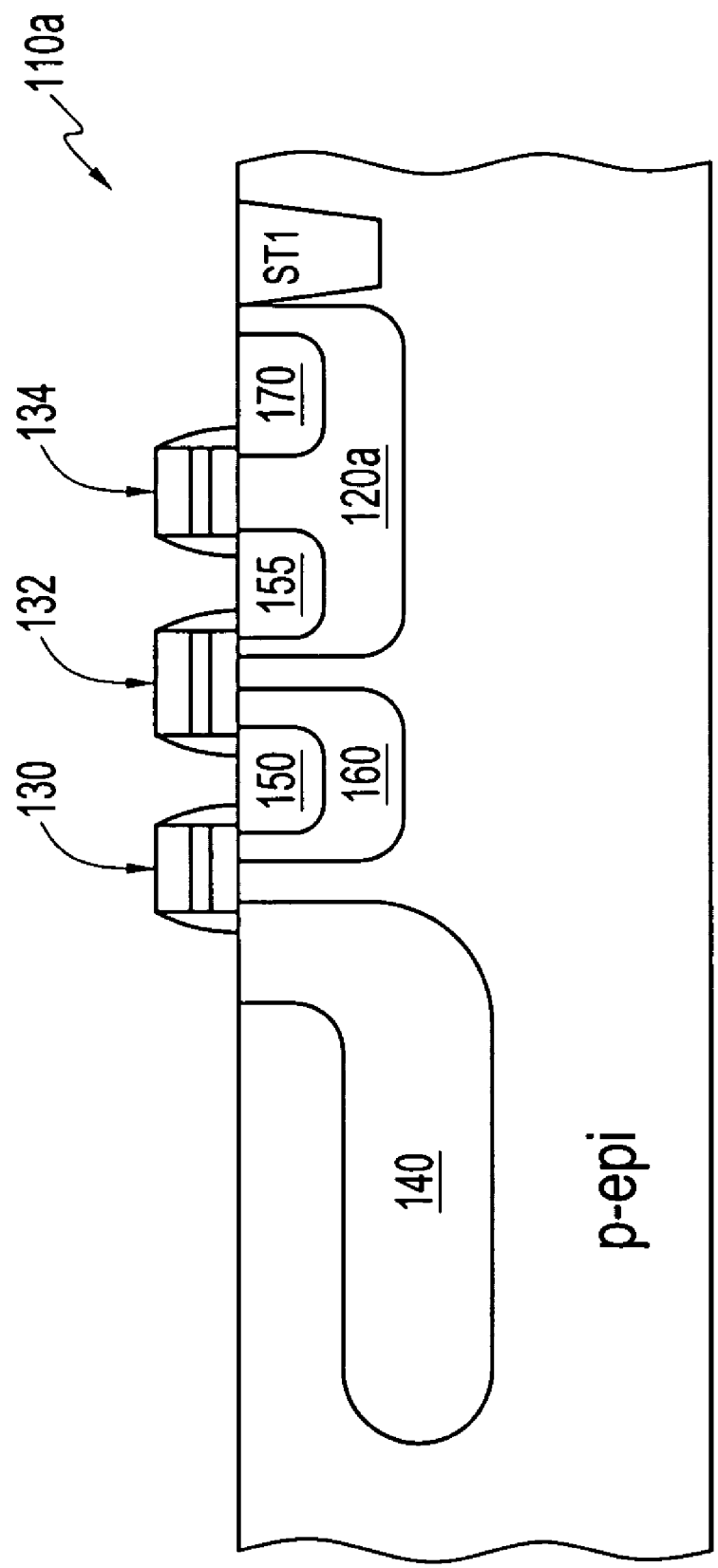
FIG. 4a illustrates a cross-section of a pixel cell in accordance with an embodiment of the present invention.

Referring now to the drawings, where like elements are designated by like reference numerals, FIG. 4a illustrates a cross-section of a pixel cell 110a constructed in accordance with a first exemplary embodiment of the present invention. Pixel cell 110a has a P-well 120a within which is formed a floating diffusion region 155 and source/drain region 170 of a reset transistor 134. The P-well 120a is doped with a doping concentration within the range of about $1 \times 10^{15}$ atoms per cm$^3$ to about $5 \times 10^{17}$ atoms per cm$^3$. Because there is a lower voltage potential in the P-well 120a than in the P-epi, any electrons generated outside the P-well 120a do not enter the P-well 120 and are prevented from contaminating any charge stored in the floating diffusion region 155. In the illustrated embodiment, the storage node 150 is encased in a separate P-well 160. Because storage node 150 is encased in P-well 160, which is separate and distinct from the main P-well 120a, electrons generated inside the main P-well 120a are prevented from entering the encasing P-well 160 and potentially contaminating the charges stored at the storage node 150. As such, the problems with the prior art pixel cell 10 are avoided by P-well pixel 160.

Figure 4B:
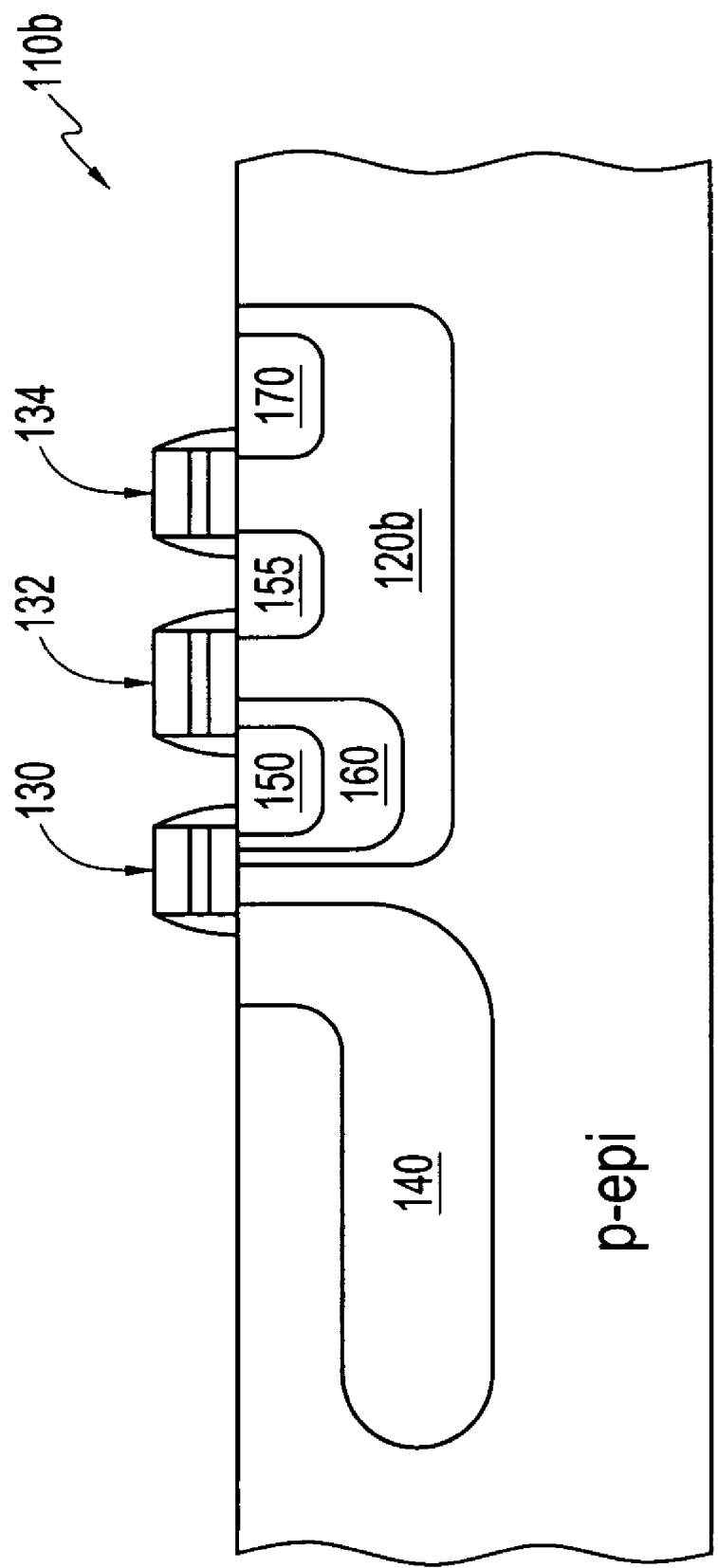
FIG. 4b illustrates a cross-section of a pixel cell in accordance with another embodiment of the present invention.

FIG. 4b illustrates a cross-section of a pixel cell 110b constructed in accordance with another exemplary embodiment of the present invention. Pixel cell 110b has a P-well 120b within which is formed a storage node 150, floating diffusion region 155 and source/drain region 170 of a reset transistor 134. Because there is a lower voltage potential between P-well 120b and the P-epi, electrons generated outside P-well 120b will not enter P-well 120b. In this embodiment, the storage node 150 is encased in P-well 160, which has a higher doping concentration than P-well 120b, creating a separate and distinct region. Since P-well 160 has a higher doping concentration than P-well 120b, P-well 160 will have a lower potential than P-well 120b, preventing electrons in P-well 120b from entering P-well 160 and effectively isolating storage node 150 from the rest of the pixel. The embodiment of FIG. 4b has an additional advantage over the embodiment illustrated in FIG. 4a because it provides superior electrical isolation such that isolation trenches such as STI are not necessary for isolating the pixel from adjacent pixels. However, the embodiment of FIG. 4b requires an additional masking step.

Figure 5:
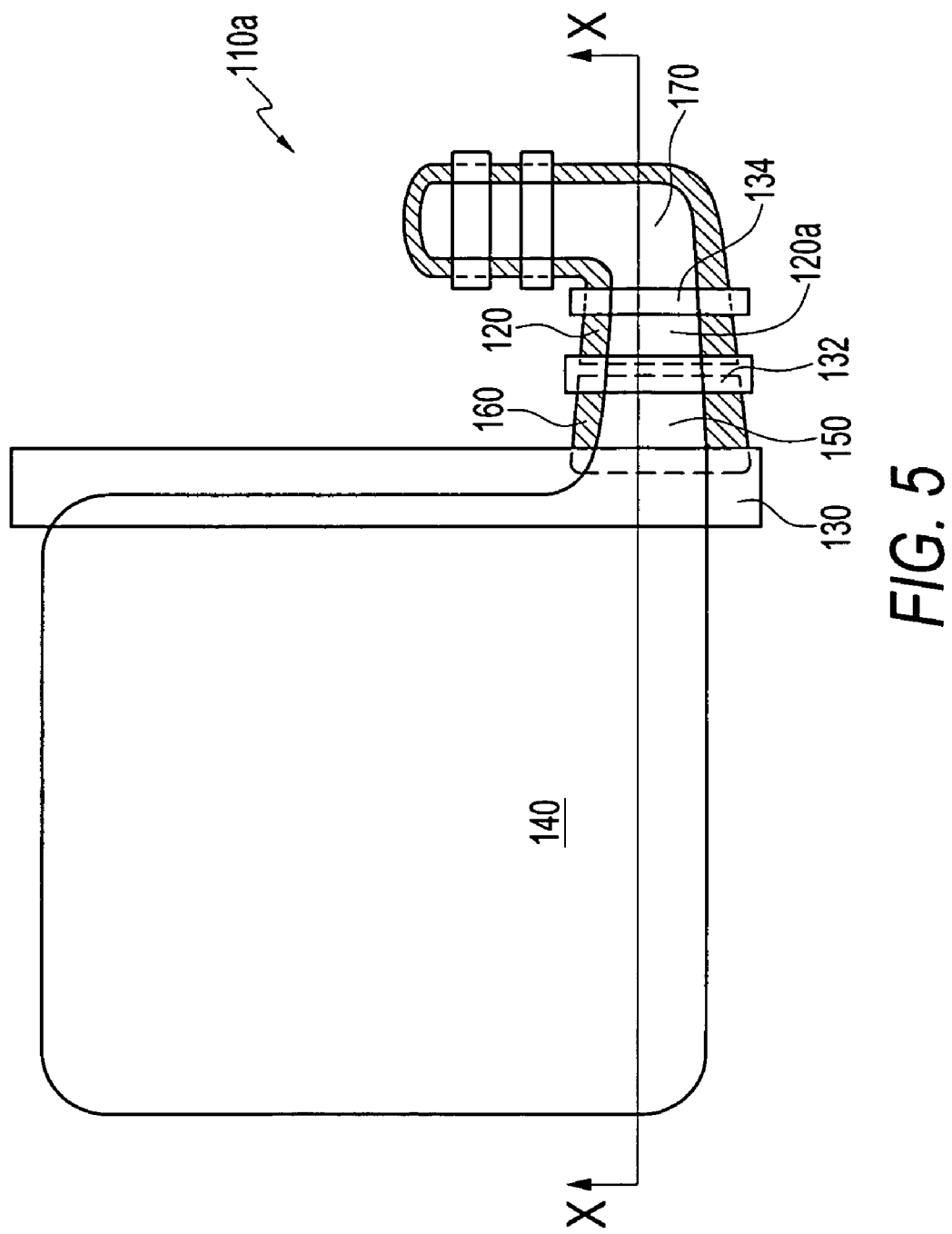

FIG. 5 is a plan view of the pixel cell 110a of FIG. 4a, FIG. 4a being a cross-sectional view taken across line X-X of FIG. 5. The encasing P-well 160 is located under storage node 150 and completely surrounds it.

Figure 6A:
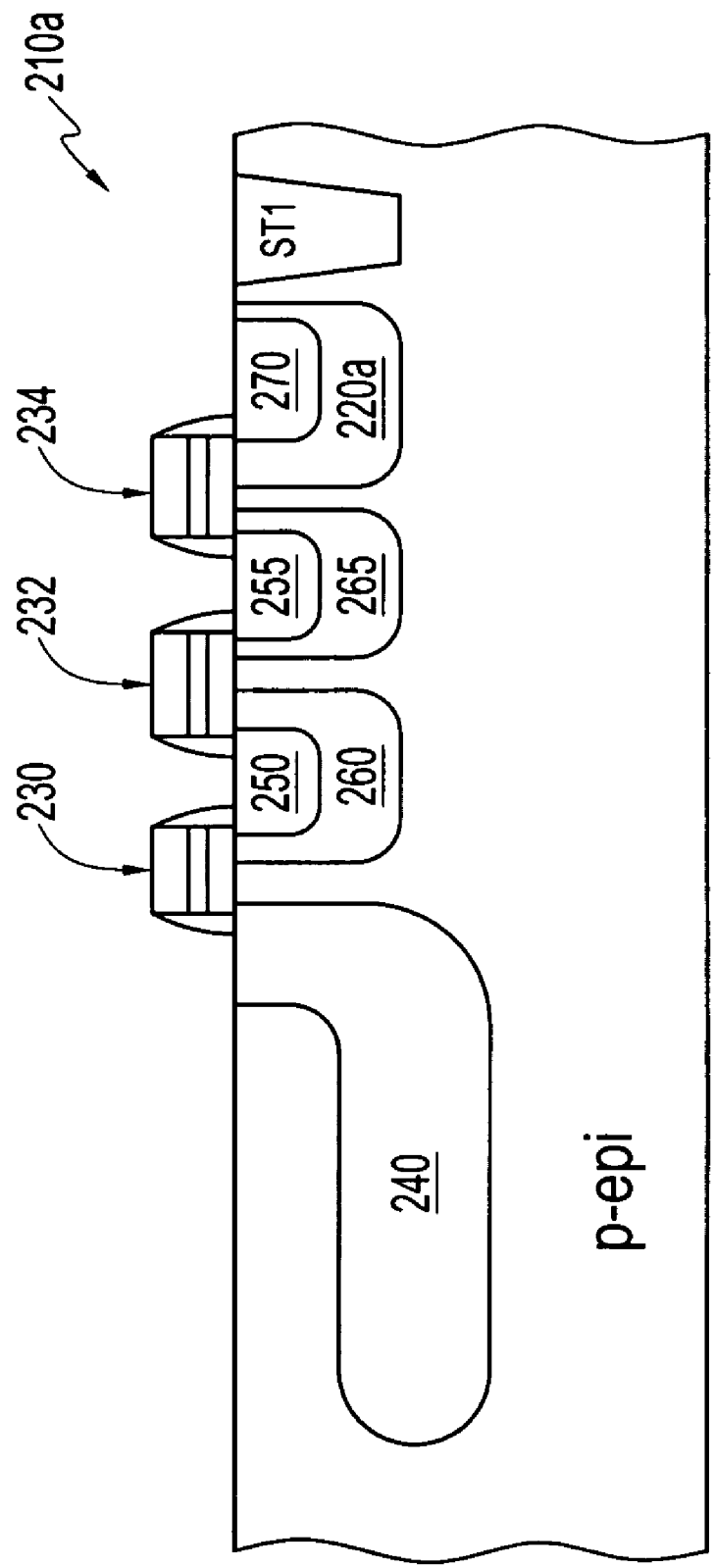
FIG. 6a illustrates a cross-section of a pixel cell in accordance with another embodiment of the present invention.

FIG. 6a illustrates a cross-section of a pixel cell 210a constructed in accordance with another exemplary embodiment of the present invention. The substrate of pixel cell 210a has a P-well 220a having a source/drain region 270 within it. The P-well 220a is doped with a doping concentration within the range of about $1\times10^{15}$ atoms per cm$^3$ to about $5\times10^{17}$ atoms per cm$^3$. The substrate also has a first P-well 260 that encases storage node 250 and a second P-well 265 that encases floating diffusion region 255. In this embodiment, the storage node 250 and floating diffusion region 255 are encased in P-wells 260 and 265, respectively. Because storage node 250 has been encased in first P-well 260 and floating diffusion region 255 has been encased in second encasing P-well 265, which are separate and distinct from the main P-well 220a, any electrons generated inside the main P-well 220a will be prevented from entering the P-wells 260, 265. P-wells 260, 265 have a higher doping concentration than P-well 220. The plan view of the P-wells 260, 265 with respect to the pixel cell 210a is shown in FIG. 7, FIG. 6 being a cross-section taken across line Y-Y of FIG. 7. Optionally, main P-well 220a may be omitted. Also, if the floating diffusion region 255 is used as a storage region, transistor 230 and regions 250, 260 may be omitted.

Figure 6B:
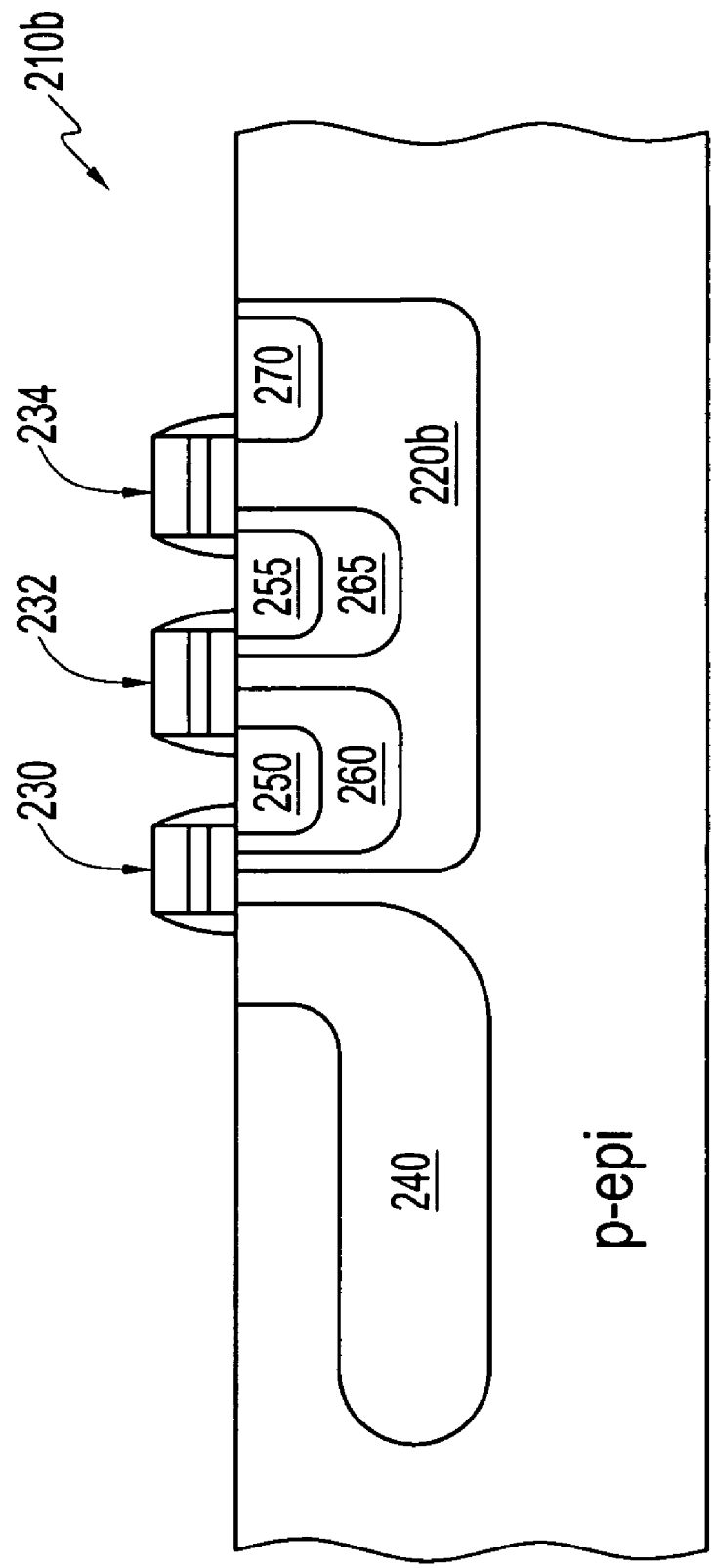
FIG. 6b illustrates a cross-section of a pixel cell in accordance with another embodiment of the present invention.
Figure 7:
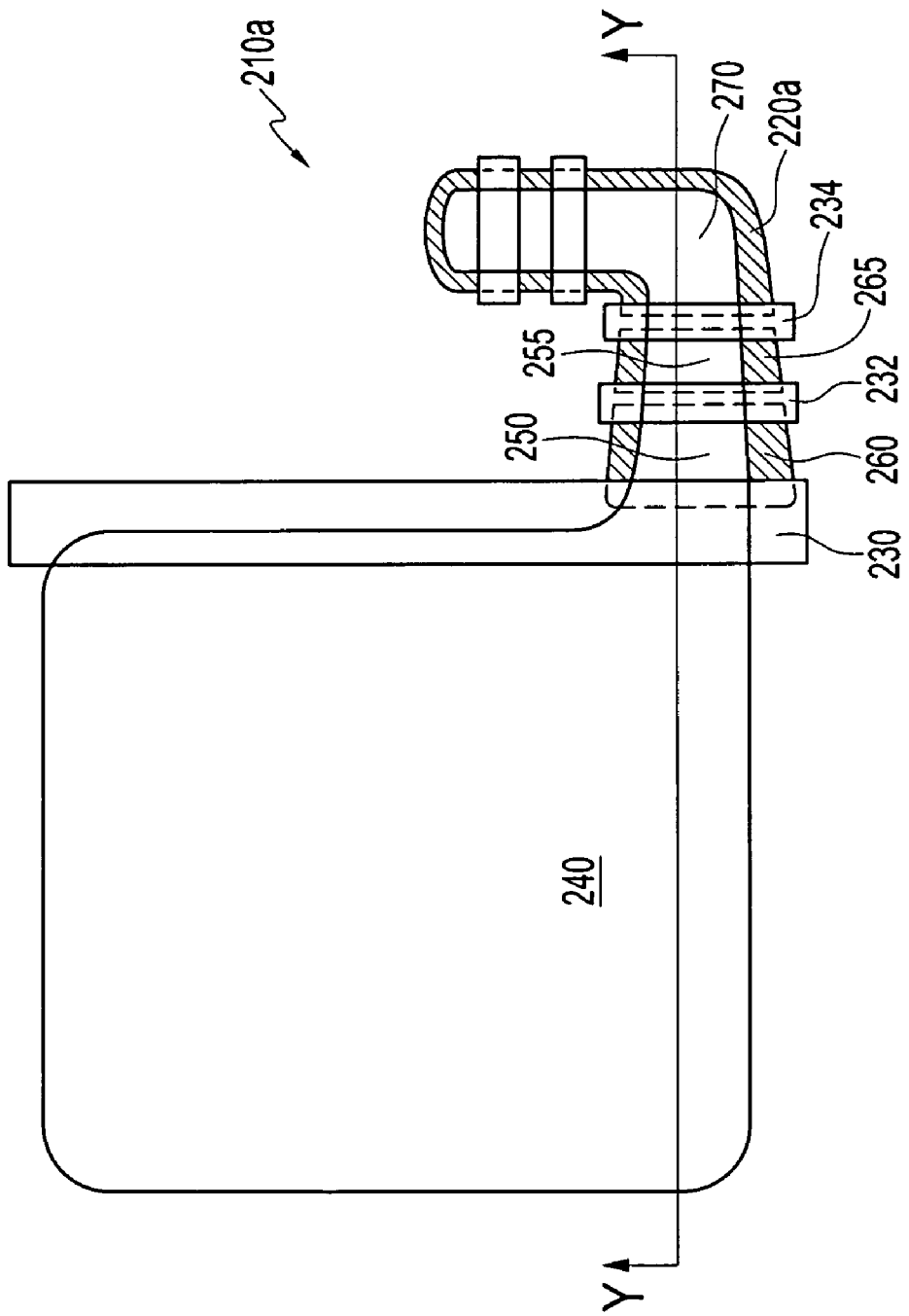

FIG. 6b illustrates a cross-section of a pixel cell 210b constructed in accordance with another exemplary embodiment of the present invention. Pixel cell 210b has a P-well 220b within which is formed a storage node 250, floating diffusion region 255 and source/drain region 270 of a reset transistor 234. Because there is a lower voltage potential between P-well 220b and the P-epi, electrons generated outside P-well 220b will not enter P-well 220b. In this embodiment, the storage node 250 is encased in P-well 260, which has a higher doping concentration than P-well 220b, creating a separate and distinct region. The floating diffusion node 255 is encased in P-well 265, which also has a higher doping concentration than P-well 220b, creating another separate and distinct region. Since P-wells 260, 265 have a higher doping concentration than P-well 220b, P-wells 260, 265 will have a lower potential than P-well 220b, preventing electrons in P-well 220b from entering P-wells 260, 265 and effectively isolating storage node 250 and floating diffusion region 255 from the rest of the pixel.

Figure 8:
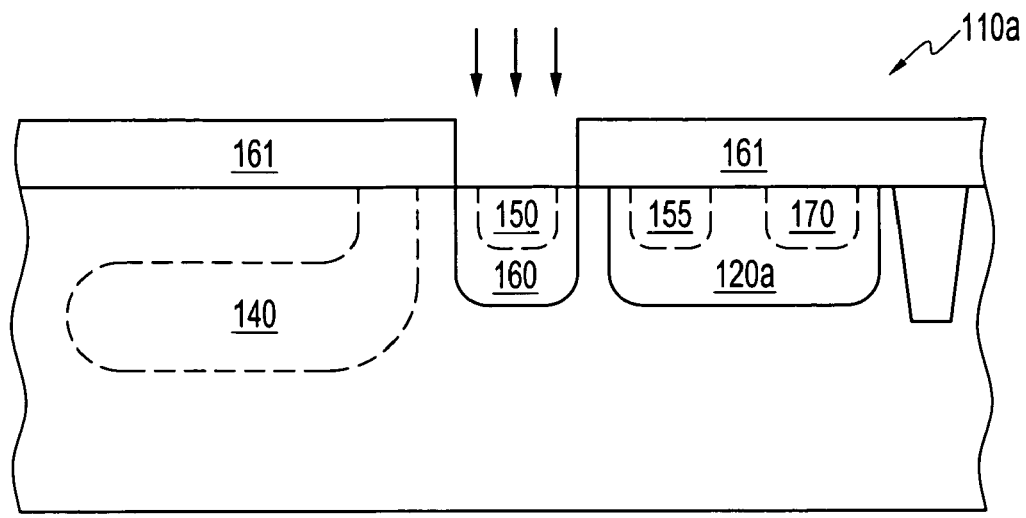
FIG. 8 illustrates a cross-section of the pixel of FIG. 4 at an early stage of construction.
Figure 9:
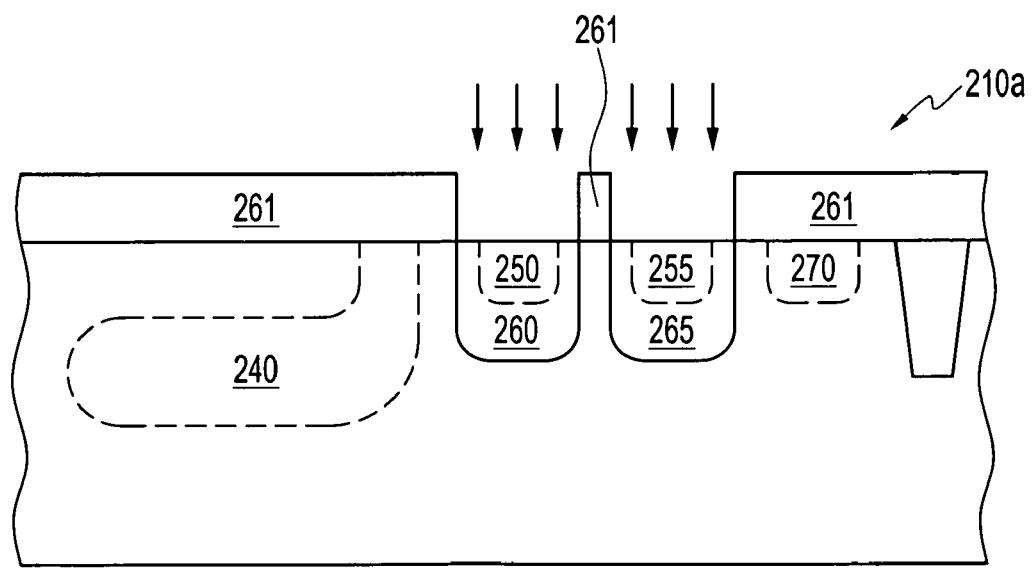
FIG. 9 illustrates a cross-section of the pixel of FIG. 6 at an early stage of construction.

FIGS. 8 and 9 illustrate cross-sections of pixel cells 110a and 210a, respectively, in an early stage of formation. As shown in FIG. 8, after the main P-well region 120a is formed, a mask 161 is formed over the substrate, leaving an opening where the encasing P-well 160 is to be formed. The dashed lines indicate where the photodiode 140, storage node 150, floating diffusion region 155 and source/drain region 170 will be formed in subsequent doping processes.

Similarly, as shown in FIG. 9, after the main P-well region 220 is formed, a mask 261 is formed over the substrate, leaving openings where the encasing P-wells 260 and 265 are to be formed. The dashed lines indicate where the photodiode 240, storage node 250, floating diffusion region 255 and source/drain region 270 will be formed in subsequent doping processes.

The invention has been described with reference to the formation of a separate P-well that surrounds the storage node and/or floating diffusion region. However, the invention also contemplates the formation of P-wells having various depths surrounding the floating diffusion region or encasing the entire STI region. Also, while the invention has been described with reference to the formation of P-wells in a pixel cell having a PNP photodiode, the invention also contemplates the formation of N-wells in a pixel cell having an NPN photodiode.

In addition, while the invention has been described in the context of a five-transistor (5T) pixel cell, the invention also contemplates use in a 4T, 6T, 7T pixel cell or more. Further, although the invention has been described above with reference to a pixel cell, the invention also has applicability to other integrated circuits. For example, the invention may be used in any integrated circuit device where isolation of an electron storage region is required.

Figure 1:
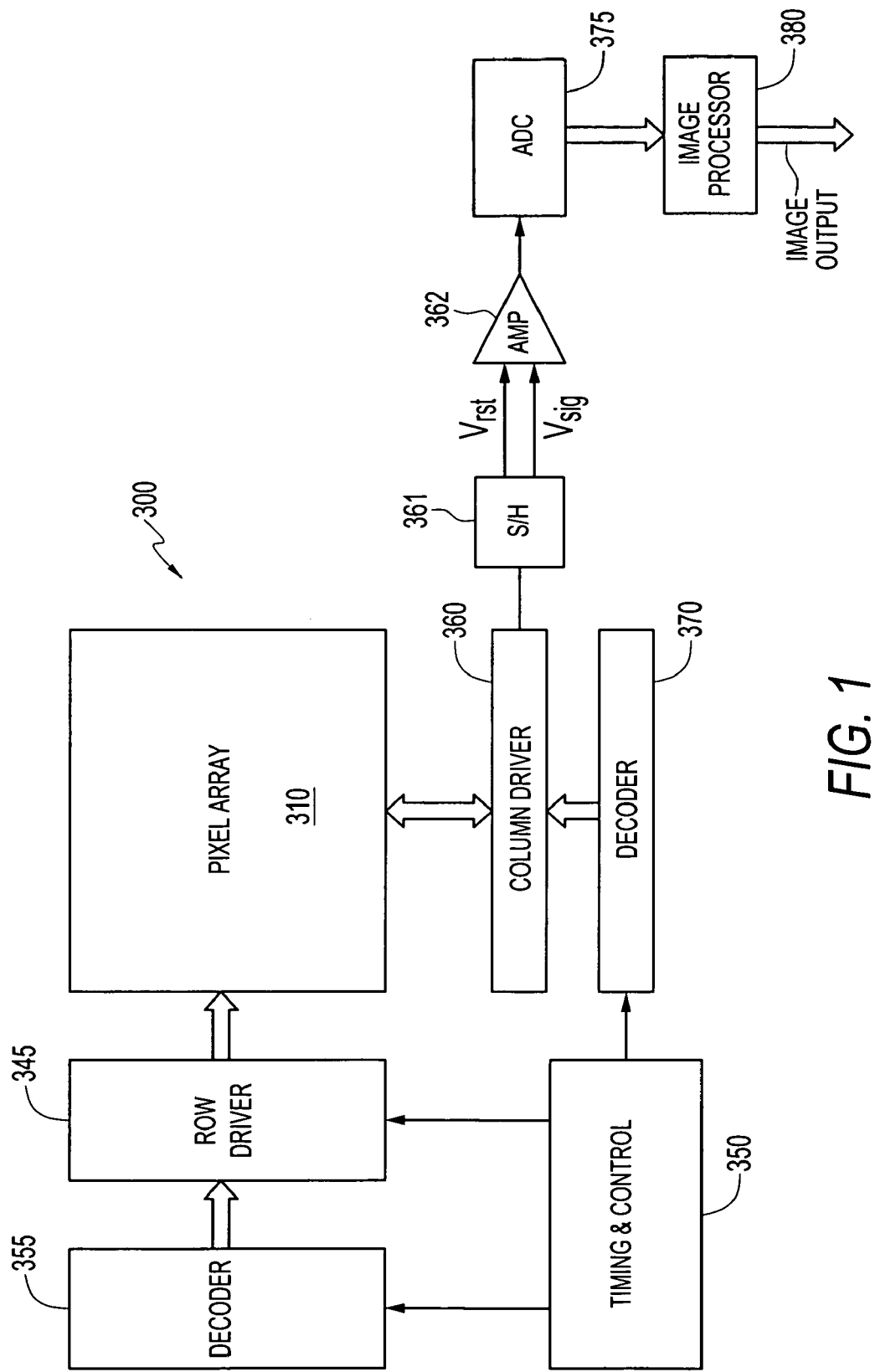
FIG. 1 illustrates a block diagram of a CMOS imager device.
Figure 2:
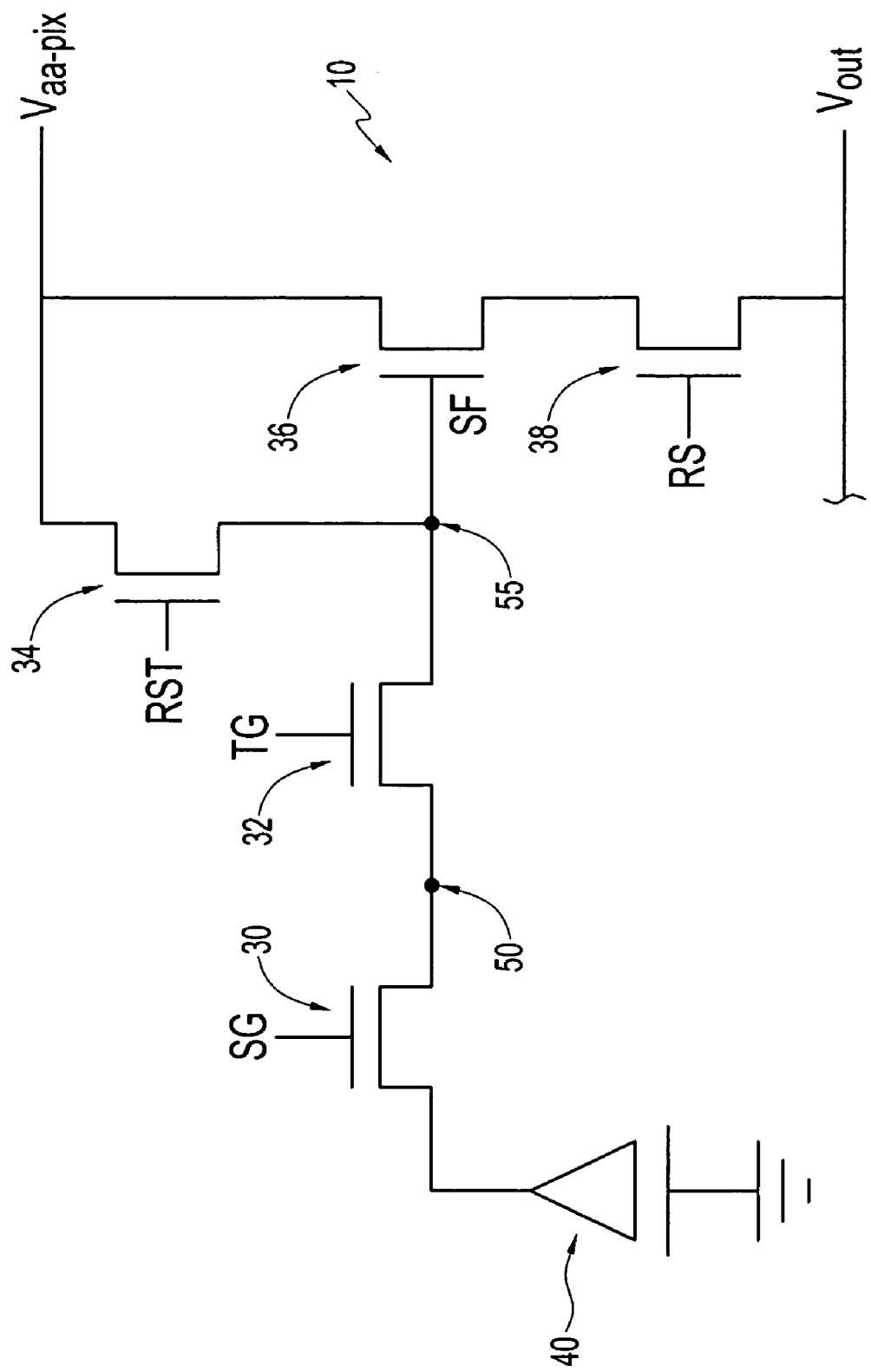
FIG. 2 illustrates a schematic diagram of a five-transistor pixel cell.
Figure 3:
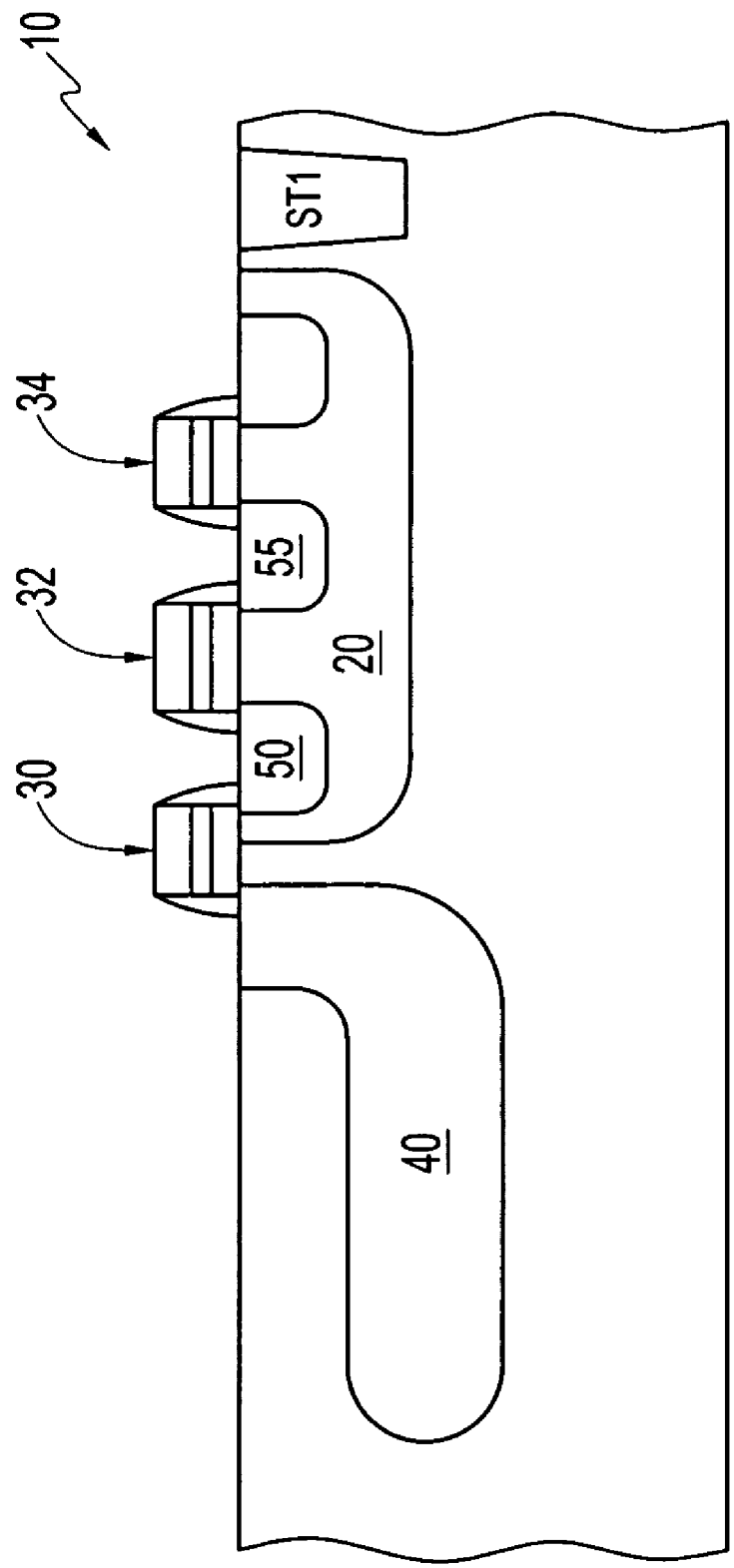
FIG. 3 illustrates a cross-section of the pixel cell of FIG. 2.
Figure 10:
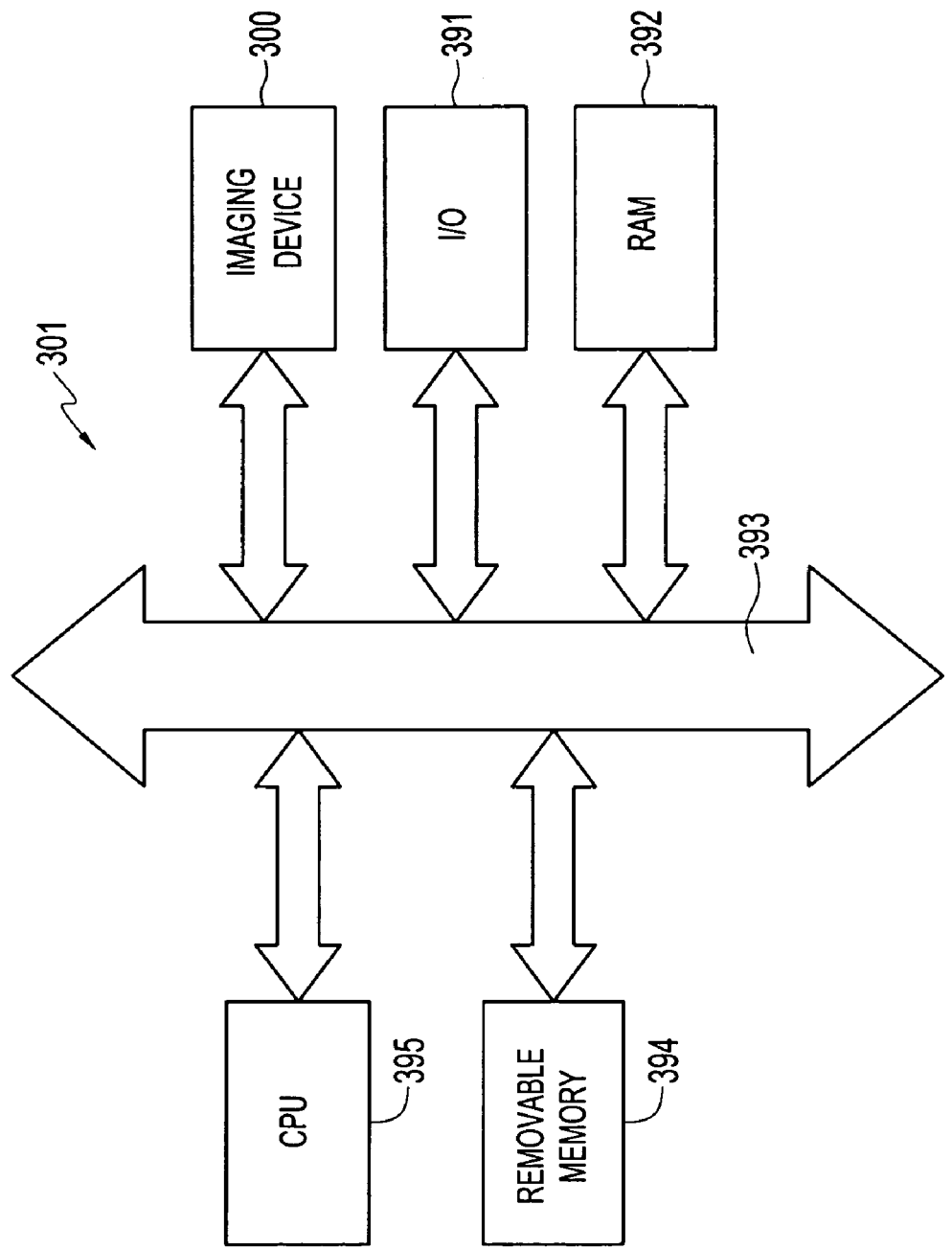
FIG. 10 illustrates a block diagram of a processor system employing a pixel cell in accordance with an embodiment of the present invention.

FIG. 10 shows in simplified form a typical processor system 301 modified to include an imaging device 300 (FIG. 1), in turn employing a pixel cell constructed in accordance with the present invention. The processor system 301 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 301, for example a camera system, generally comprises a central processing unit (CPU) 395, such as a microprocessor, that communicates with an input/output (I/O) device 391 over a bus 393. Imaging device 300 also communicates with the CPU 395 over bus 393. The system 301 also includes random access memory (RAM) 392 and can include removable memory 394, such as flash memory, which also communicate with CPU 395 over the bus 393. Imaging device 300 may be combined with a processor, such as a CPU, digital signal processor, or microprocessor, with or without memory storage on a single integrated circuit or on a different chip than the processor.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A pixel cell comprising:
    a first well region of a first conductivity type in a substrate;
    a photosensor within said substrate for generating photoelectrons;
    a storage region entirely within a second well region of greater doping concentration than said first well region and of said first conductivity type for storing photoelectrons generated by said photosensor; and
    a floating diffusion region within said first well region of said first conductivity type for receiving photoelectrons from said storage region.

2. The pixel cell of claim 1, wherein said first conductivity type is P-type conductivity.

3. The pixel cell of claim 1, wherein said first conductivity type is N-type conductivity.

4. The pixel cell of claim 1, wherein said second well region is in contact with said storage region.

5. The pixel cell of claim 1, further comprising a source/drain region of a reset transistor within said first well region.

6. The pixel cell of claim 1, wherein said storage region and said second well region are within said first well region.

7. A pixel array comprising:
    a plurality of pixels, at least one of said plurality of pixels comprising:
    a photosensor within a substrate for generating photoelectrons;
    a storage gate transistor;

a storage region within a first P-well region for storing, upon activation of said storage gate transistor, photoelectrons generated by said photosensor;

a transfer gate transistor; and a floating diffusion region in a second P-well region for receiving, upon activation of said transfer gate transistor, photoelectrons stored in said storage region.

8. The pixel array of claim 7, wherein said first P-well region prevents photoelectrons not transferred via said storage gate transistor from entering said storage region.

9. The pixel array of claim 7, further comprising a reset transistor having a source/drain region within said second P-well region.

10. The pixel array of claim 7, further comprising a reset transistor having a source/drain region within a third P-well region.

11. The pixel array of claim 7, wherein said first P-well region is in contact with said storage region.

12. The pixel array of claim 7, wherein said storage region and said first P-well region are within said second P-well region.

13. The pixel array of claim 12, wherein said first P-well region has a greater doping concentration than said second P-well region.

* * * * *

UNITED STATES PATENT AND TRADEMARK OFFICE
CERTIFICATE OF CORRECTION

PATENT NO. : 7,605,440 B2 Page 1 of 1
APPLICATION NO. : 11/399357
DATED : October 20, 2009
INVENTOR(S) : Parker Altice It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 209 days.

Signed and Sealed this

Fifth Day of October, 2010

David J. Kappos
*Director of the United States Patent and Trademark Office*